United States Patent [19]

Galanti

[11] 4,120,682

[45] Oct. 17, 1978

[54] INSTALLATION FOR SUPERFICIALLY TREATING THE OUTER SURFACES OF BOTTLES

[75] Inventor: Maurice R. G. Galanti, Ransart, Belgium

[73] Assignee: Institut National du Verre, Charleroi, Belgium

[21] Appl. No.: 857,713

[22] Filed: Dec. 5, 1977

[30] Foreign Application Priority Data

Mar. 25, 1977 [BE] Belgium ............................. 0176141

[51] Int. Cl.² ................................................. C03C 17/00
[52] U.S. Cl. ..................................... 65/181; 65/60 R; 118/48; 118/61
[58] Field of Search ............... 65/181, 60 R; 118/48, 118/61, 65

[56] References Cited

U.S. PATENT DOCUMENTS

| | | | |
|---|---|---|---|
| 2,155,932 | 4/1939 | Davis | 118/48 X |
| 2,899,528 | 8/1959 | Reichelt | 118/48 X |
| 3,353,514 | 11/1967 | Lyle | 65/60 R X |
| 3,438,803 | 4/1969 | Dubble et al. | 65/60 R X |
| 3,561,940 | 2/1971 | Scholes | 118/48 X |
| 3,658,304 | 4/1972 | Hall et al. | 118/48 X |
| 3,659,551 | 5/1972 | McKinstry | 118/48 |

*Primary Examiner*—Arthur D. Kellogg
*Attorney, Agent, or Firm*—Sughrue, Rothwell, Mion, Zinn and Macpeak

[57] ABSTRACT

The present invention relates to an installation for superficially treating the outer surfaces of glass bottles which are already shaped but not yet annealed.

The installation comprises a tunnel in which the bottles can be longitudinally displaced and subjected to the action of a gaseous reaction mixture comprising air and a gaseous reagent. Said mixture is produced in an evaporator which is supplied with hot liquid reagent and is traversed by a current of air for evaporating the liquid reagent.

The tunnel has at an inlet for the bottles, two lateral inlet openings for admitting gaseous reactive mixture and, at an outlet for the bottles, a collector for collecting the mixture. The tunnel has a recycling conduit provided with a sucking fan and a cooler and extending from the collector to two derived conduits which open into the two inlet openings so as to obtain over the entire length of the path of the bottles and around said bottles in the tunnel a flux of constantly recycled gaseous reactive mixture.

The evaporator has at least one drop-by-drop feed member arranged to deliver liquid reagent at an adjustable flow rate by hot, filtered and dehydrated air to form substantially continuously added portions of gaseous reactive mixture. Said portions are suitably heated and continuously introduced into the recycling conduit to be homogenized with the recycled flux of the gaseous reactive mixture.

6 Claims, 2 Drawing Figures

INSTALLATION FOR SUPERFICIALLY TREATING THE OUTER SURFACES OF BOTTLES

BACKGROUND OF THE INVENTION

The present invention relates to an installation for treating superficially the outer surfaces of glass bottles already shaped but not yet annealed.

In this specification the term bottle should be understood to indicate not only bottles as such but also phials, jugs, glass containers and the like.

Superficial treatment of bottles comprises reacting a reactive gaseous mixture with the glass of the bottles. Such a treatment aims, on the one hand, at improving the mechanical properties of the bottles, especially their shock resistance, and, on the other hand, at making their outer face more suitable for further cold treatment.

The treatment installation is mounted in a bottle production line between a shaping machine and an annealing tunnel or furnace.

The treatment installation essentially comprises a tunnel along which bottles are longitudinally displaced and are subjected to the action or effect of the gaseous reactive mixture. The gaseous reactive mixture substantially comprises air and a gaseous reactant. Th gaseous reactive mixture is produced in an evaporator which is supplied with a reactive liquid and is traversed by an air current which evaporates the reactive liquid.

THE PRIOR ART

In conventional treatment installations of this kind, the evaporator comprises a tank or reservoir permanently containing a certain amount of reactive liquid. The reservoir is traversed by a current of air above the surface of the reactive liquid. While passing from an inlet to an outlet of the reservoir, the air current causes the evaporation of a certain amount of reactive liquid depending upon the vapour tension pressure of the liquid and its temperature. Moreover, the reservoir forming the evaporator is arranged at a distance from the tunnel for treating the bottles.

On the other hand, in the conventional installations, the gaseous reactive mixture produced in the evaporator is distributed in the treatment tunnel by a plurality of distribution ramps or zones formed by perforated tubes which are closed at their free end and communicate with a conduit feeding the gaseous reactive mixture. Furthermore, in these installations in which the gaseous reactive mixture is recycled for treating the bottles, the recycling ducts for the mixture are installed laterally on the treatment tunnel.

The known installations have several drawbacks.

The reactive gaseous mixture produced in the evaporator always has a very risky composition with respect to the entraining air, the temperature of the reactive liquid being the same. Thus, the gaseous reactive mixture used in the treatment tunnel has a composition difficult to control owing to the heating inertia of the reactive liquid contained in the evaporator, in order to modify the temperature of the liquid. Accordingly, as the temperature of the air supplied to the evaporator is the only parameter which could modify the gaseous reactive mixture employed, the treatment of the bottles lacks flexibility with respect to the variety of articles to be treated.

Furthermore in the treatment tunnel of the conventional installations, the gaseous reactive mixture distributed by the distribution ramps is laterally and locally deflected so as to circulate mostly transversaly between the bottles being displaced in the tunnel. Consequently, the gaseous reactive mixture is irregularly distributed along the distribution ramp or zone owing to possible pressure differences at the ramp. Moreover, transverse passage of the gaseous reactive mixture between the bottles allows only relatively short and random contact between the mixture and the bottles so that the efficiency of the treatment can be irregular and insufficient.

SUMMARY OF THE INVENTION

The present invention relates to an installation for superficially treating the outer surfaces of glass bottles already shaped but not yet annealed. Said installation comprises a tunnel in which the bottles can be longitudinally displaced and subjected to the action of a gaseous reactive mixture comprising air and a gaseous reagent. Said mixture is produced in an evaporator which is supplied with hot liquid reagent and is traversed by a current of air for evaporating the liquid reagent. The tunnel has, at an inlet for the bottles, two lateral inlet openings for admitting gaseous reactive mixture and, at an outlet for the bottles, a collector for collecting the mixture. The tunnel has a recycling conduit provided with a sucking fan and a cooler and extending from the collector to two derived conduits which open into the two inlet openings. Consequently, in the new installation, it is possible to obtain over the entire length of the path of the bottles and around the bottles in the tunnel a flux of constantly recycled gaseous reactive mixture. Moreover the evaporator has at least one drop-by-drop feed member arranged to deliver an adjustable flow rate of liquid reagent which is evaporated by an adjustable flow rate of hot, filtered and dehydrated air, in order to form substantially continuously added portions of fresh gaseous reactive mixture. Said added portions are suitably heated and continuously introduced into the recycling conduit and are homogenized therein with the recycled flux of the gaseous reactive mixture.

With respect to the conventional treatment installation it is provided in the new treatment installation that the tunnel has at its inlet end for the bottles, two lateral openings for feeding reactive mixture, and, at its outlet of the bottles, a collector for collecting the mixture. Furthermore, the tunnel has a recycling conduit comprising a sucking fan and a cooler. The recycling conduit extends from the collector and is subdivided into two derived conduits opening into the two inlet openings. In this way, there is obtained a constant flow of gaseous reactive mixture in the tunnel all along the path of the bottles and around them, the mixture being permanently recycled. Moreover, the evaporator comprises at least one drop-by-drop feed member arranged to feed an adjustable flow rate of the reactive liquid which is evaporated by an adjustable flow rate of hot filtered and dehydrated air. By means of the drop-by-drop feed member, added portions of fresh gaseous reactive mixture are constantly formed, said portions being suitably heated and continuously supplied to the recycling conduit. In this way, the added amounts of fresh gaseous reactive mixture are thoroughly mixed and homogenized with the recycled flux of the gaseous reactive mixture.

Thus, in the new treatment installation, the distribution and the circulation of the gaseous reactive mixture through the tunnel not only ensure a regular supply and a balanced distribution of the reagent in the tunnel, but also a sufficiently long contact time between this reagent and the bottles. In the evaporator of the new treatment installation, it is possible to adjust easily the proportion of the gaseous reagent in the air of the reactive mixture by adjusting the flow rate of the liquid reagent and/or tha of the hot air.

Moreover, with the new treatment installation, it is possible to recover and reuse the residual gaseous reactive mixture at the outlet of the treatment tunnel to chemically and thermically condition it again, particularly by means of the added portions of fresh gaseous reactive mixture added into the recycling conduit in order to feed this treatment tunnel at the inlet of the bottles with a gaseous reactive mixture wich is constantly controlled and correctly adjusted to obtain the maximum treatment of these bottles into this tunnel.

In order to direct the gaseous reactive mixture as tangentially as possible with respect to the path of the bottles at the inlet of the tunnel and to eliminate as far as possible loosses of mixture at the inlet, the new treatment installation comprises its derived conduits which are directed at the same time towards the inside and towards the outlet of the tunnel near to the lateral inlet openings.

In the new treatment installation, the cooler of the recycling conduit may be arranged upstream of the sucking fan, whereas the feed conduit of additional amounts of fresh gaseous reactive mixture may communicate with this recycling conduit downstream of the suction fan. In this way maximum homogenity of the resulting mixture may be obtained.

To permit evaporation of the entire amount of reactive liquid used in the evaporator of the new treatment installation, this evaporator may comprise, besides the drop-by-drop feed member, a dripping member which has an upper basin or recess in which the reactive liquid falls drop-by-drop and overflows laterally. Moreover, the flow rates of the air and the reactive liquid may be suitably chosen so that the homogeneity of the gaseous reactive mixture may be obtained by particular admission of evaporating air at a suitable flow rate and by taking advantage of the inner structure of the evaporator.

In the new treatment installation, the supply conduit of the added portions of the fresh gaseous reactive mixture may comprise a reheater. This feature makes it possible to keep the recycled gaseous reactive mixture at normal operating temperatures.

Advantageously, the evaporator of the new treatment installation is mounted on the frame of the tunnel. This characteristic makes it possible to obtain as short as possible the path for the additional portions of the fresh gaseous reactive mixture before introduction in the tunnel together with the recycled gaseous reactive mixture. In this way, the concentration of the obtained and re-used gaseous reactive mixture is maintained constant for a given treatment.

BRIEF DESCRIPTION OF THE DRAWINGS

The invention will be further described by way of example with reference to the accompanying drawings in which.

In the figures, the same elements have been indicated by the same reference numberals.

DESCRIPTION OF THE PREFERRED EMBODIMENT

Figure 1:
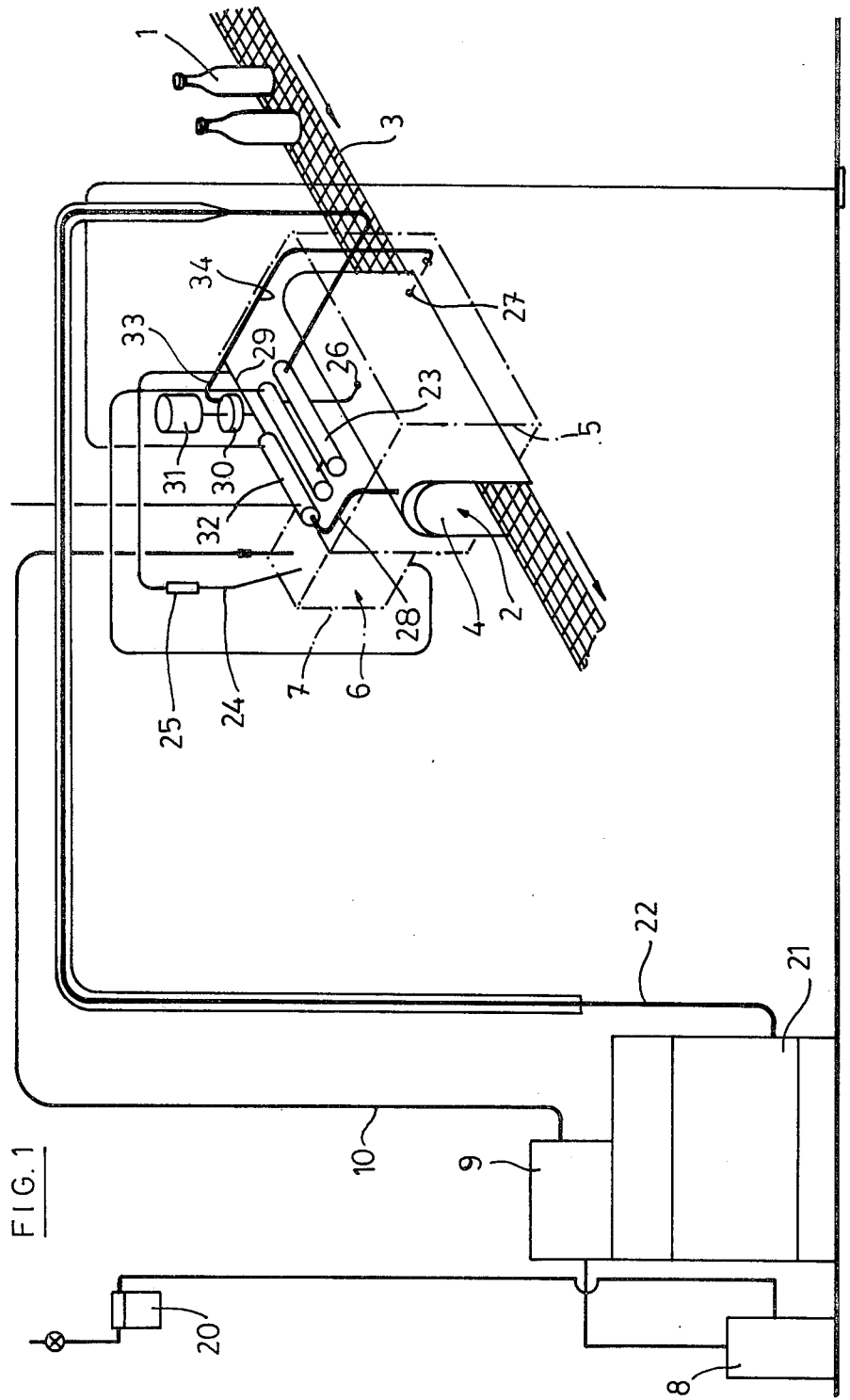
FIG. 1 is a perspective diagrammatic view of a preferred embodiment of the new treatment installation and FIG. 2 is an axial vertical cross-section of an evaporator of the installation according to FIG. 1.
Figure 2:
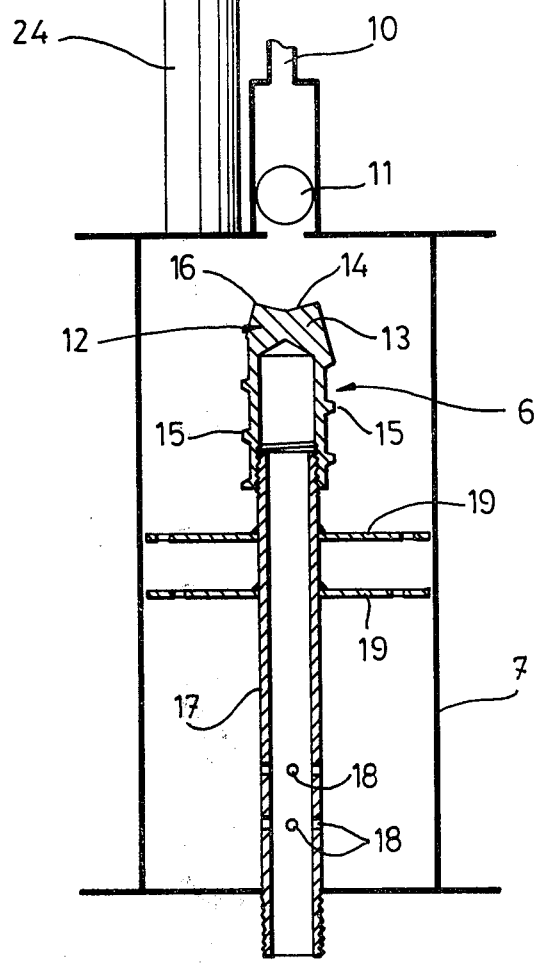

The illustrated installation serves to superficially treat glass bottles 1. The installation is arranged between a forming or shaping machine and a annealing tunnel or furnace for the bottles 1. Actually, the installation treats the outer surfaces of the bottles 1 which consist of hot glass and which are already shaped but not yet annealed.

The treatment installation for the bottles 1 substantially comprises a treatment tunnel 2 arranged above and on both sides with respect to the straight path of the bottles 1, which are successively conveyed one after the other on a horizontal endless conveyor 3. A cross-section of the tunnel 2 rectangular in shape except at its upper part which is semi-circular.

The tunnel 2 is constituted by a sleeve or a collar 4 of metal sheet which is laterally straight and arched at its upper part. The sleeve or collar 4 is mounted in a frame 5 which is also metallic and has side walls which form a box-like body open upwardly.

The heat treatment of the bottles 1 comprises contacting a gaseous reactive mixture with the outer surfaces of the bottles 1 while the bottles pass through the inside of the tunnel 2. This treatment of the bottles 1 aims at hardening their outer surface and thus improving their mechanical characteristics, and in particular their shock resistance. The principle of such a cold treatment is known per se.

The gaseous reactive mixture comprises air and a suitable gaseous reactant or reagent.

The realisation of the gaseous reactive mixture by means of air and liquid reagent is produced in an evaporator 6 comprising a metal enclosure or vessel 7 which is closed and fixed to a side wall of the frame 5.

The liquid reagent is initially contained in a supply reservoir or tank 8 from where it is withdrawn by means of a small pump at an adjustable flow rate and passes through a precise metering apparatus 9. The metering apparatus includes electronic control and regulation means for the small pump and electromagnetic distribution valves. The assembly comprising the small pump and the metering apparatus is not shown. The reagent liquid which has been pumped and metered is supplied to the evaporator 6 by way of a conduit 10 which opens into the upper wall of the vessel 7.

The end of the supply conduit 10 is provided with means 11 which allows the liquid reagent to pass through drop-by-drop. Drops of liquid reagent successively fall onto a suitable member comprising a hollow metal body 12, an upper closed portion 13 of which has a basin or recess 14 oriented upwards. The side face of the body 12 is formed with a helical screw thread 15 over its entire length. Drops of liquid reagent fall onto the central part of the basin or recess 14 and fill it rapidly. After that, liquid reagent overflows the upper circular edge 16 of the basin or recess 14 and drips along the helical thread 15.

In the evaporator 6, the threaded member 11 is fixed to the upper threaded part of a vertical metal tube 17 which extends downwards through the bottom of the vessel 7. The tube 17 has horizontal rows of bores 18 and has, above the bores 18, two perforated plates 19 which are arranged horizontally and spaced from each other.

The air in the reactive mixture supplied by a compressed air source 20 is conditioned in a conditioning appraratus 21. Conditioning of the air essentially comprises filtering, dehydration and flow rate regulation. It is then mainly a matter of a physical purification of the air. The conditioning apparatus mainly comprises filters, a drier, control gauges, and manually operated pressure and flow-rate regulators.

Purified and dried air is supplied to the evaporator 6 by way of a feed conduit 22 which passes through a twostage heater 23 and is connected to the lower end of the perforated tube 17 of the evaporator 6. The heater 23 is mounted on one of the side walls of the abovementioned frame 5.

Hot air in the reactive mixture thus supplied to the perforated tube 17 passes through the bores 18 in the tube and enters the lower part of the vessel 7. This air then passes through the perforations in the plates 19 and is thus distributed to the upper part of the vessel 7. It is there that hot air contacts the reactive film which is dripping along the dripping member 11 and which is thus completely evaporated. By suitable adjusting the flow rate of the air and that of the liquid reagent it is possible to advantageously modify the relative amounts of the two gaseous constituents of the reactive mixture.

The hot gaseous reactive mixture thus obtained in the evaporator 6 leaves this evaporator through a conduit 24 which extends from the upper side wall of the vessel 7 to a place where the fresh gaseous reactive mixture is injected in a flow of the same mixture which has already been used and which is recycled. The conduit 24 passes through an electric heater 25 arranged to maintain the temperature of the fresh gaseous reactive mixture within narrow limits before being introduced in the flux of the recycled gaseous reactive mixture.

In the tunnel 2, the bottles 1 are treated by a flux of gaseous reactive mixture which is pratically almost constantly recycled. To this end a flux of gaseous reactive mixture is supplied to the tunnel 2 through two side inlet openings 26 and 27 which are respectively disposed at the base of the two vertical portions of the sleeve 4 of the tunnel 2, near to the inlet of the bottles 1, the inlet openings 26 and 27 being opposite one another. In this way, the flux of gaseous reactive mixture is subdivided into two parts which are directed in the direction of movement of the bottles 1 through the tunnel 2, and thus come into contact with the outer surfaces of the bottles 1 to react with the glass and to harden it. Moreover, the tunnel 2 comprises at least one manifold or collector 28 arranged at the outlet of the bottles 1. The collector 28 serves to suck the flow of gaseous reactive mixture which has longitudinally traversed the tunnel 2. To this end, the collector 28 communicates with a recycling conduit 29 which comprises a fan or ventilator 30 controlled by a speed variator 31. The speed variator 31 makes it possible to vary the speed of the recycled gaseous reactive mixture, and thus to selectively and controllably vary the homogeneity and the amount of gaseous reactive mixture throughout the path of the bottles within the tunnel and around the bottles depending upon their shape and their capacity. Upstream of the fan 30, the recycling conduit 29 passes through a cooler 32 arranged to cool the flux of recycled gaseous reactive mixture. Downstream of the fan 30, the recycling conduit 29 is connected to the conduit 24 designed to supply fresh gaseous reactive mixture, whereas beyond this connection, the recycling conduit 29 is branched into two conduits 33 and 34 which respectively extend along the large side walls of the frame 5 and pass through these walls at a lower position to communicate with the inlet openings 26 and 27 in the tunnel 2. Advantageously, the lower end portions of the conduits 33 and 34 are curved and directed towards the inside and the outlet of the tunnel, respectively, in order to guide the two parts of the flux of the gaseous reactive mixture so as to eject them as tangentially as possible with respect to the path of the bottles 1 being displaced.

It should be noted that the evaporator 6 for forming fresh gaseous reactive mixture is mounted on the frame 5 of the tunnel 2, and the supply conduit 24 of fresh gaseous reactive mixture comprises a heater 25, while remaining relatively short. The last two characteristics result in regular amounts of fresh gaseous reactive mixture being supplied by the evaporator 6 substantially within narrow temperature limits all along the conduit 24, these amounts being also rapidly introduced in the flux of recycled gaseous reactive mixture flowing in the recycling conduit 29. Accordingly, the composition and the alteration of the fresh gaseous reactive mixture before is introduction into the flux of recycled gaseous reactive mixture is subtantially avoided. On the other hand, branching of the supply conduit 24 to the recycling conduit 29 upstream of the conduits 33 and 34 allows sufficient homogenization of the added portions of fresh gaseous reactive mixture and the flux of recycled gaseous reactive mixture to be obtained before the mixture is injected into the tunnel 2.

The added portions of the fresh gaseous reactive mixture constantly added to the flux of recycled gaseous reactive mixture make it possible to compensate for unavoidable losses of mixture at the ends of the tunnel 2 and to maintain constant the effectiveness of the mixture.

Of course, the invention is not limited exclusively to the illustrated embodiment and many modifications can be made in the shape, arrangement and constitution of certain constructional elements provided that these modifications are not in contradiction with the scope of the following claims.

I claim:

1. An installation for superficially treating the outer surfaces of glass bottles which are already shaped but not yet annealed, said installation comprising:
    a tunnel,
    an inlet for the bottles in said tunnel,
    an outlet for said bottles in said tunnel,
    means for longitudinally displacing said bottles into said tunnel,
    an evaporator,
    means for supplying said evaporator with hot liquid reagent,
    means for supplying said evaporator with a current of hot, filtered and dehydrated air,
    at least one drop-by-drop feed member arranged into said evaporator for delivering said liquid reagent at an adjustable flow rate, whereby said current of air when traversing said tunnel evaporates said delivered liquid reagent in order to produce a gaseous reactive mixture containing said air and said gaseous reagent,
    two lateral inlet openings at said inlet of said tunnel for admitting a flow of gaseous reactive mixture into said tunnel
    a collector at said outlet of said tunnel for collecting said gaseous reactive mixture having traversed said tunnel a recycling conduit extending from said collector to two derived conduits which open into said lateral inlet openings a sucking fan provided in said recycling conduit for moving said gaseous reactive mixture through said recycling conduit and said derived conduits a cooler mounted on said recycling conduit for cooling said gaseous reactive mixture, a supply conduit extending from said evaporator to said recycling conduit for continuously introducing added portions of fresh gaseous reactive mixture into said recycled gaseous reactive mixture flowing through said recycling conduit, heating means mounted on said supply conduit for suitably heating said added portions of fresh gaseous reactive mixture before their introducing into said recycling conduit. so as to obtain a constantly thermically and chemically reconditionned gaseous reactive mixture formed by said both recycled and fresh gaseous reactive mixtures and flowing through said tunnel over the entire length of the path of said bottles and around said bottles to act thereon.

2. An installation as claimed in claim 1, in which said derived conduits are directed towards the inside and the outlet of said tunnel near to said lateral inlet openings.

3. An installation as claimed in claim 2, in which said cooler of said recycling conduit is mounted upstream of said sucking fan whilst said supply conduit for said added portions of fresh gaseous reactive mixture is branched to said recycling conduit downstream of said sucking fan so as to ensure maximum homogeneity of said resulting gaseous reactive mixture.

4. An installation as claimed in claim 1 in which beside said drop-by-drop feed member, said evaporator has a dripping member having an upper recess in which said liquid reagent is arranged to fall and laterally overflow, the flow rate of said air and said liquid reagent being chosen so that said liquid reagent is completely evaporated in said air.

5. An installation as claimed in claim 4, in which said supply conduit of said added portions of said fresh gaseous reactive mixture is provided with a heater so that said gaseous reactive mixture is continuously maintained at normal operating temperatures.

6. An installation as claimed in claim 5, in which said evaporator is mounted on the frame of said tunnel so that the concentration of reactive elements of said gaseous reactive mixture is constant for a predetermined treatment.

* * * * *